United States Patent
Sharan et al.

(10) Patent No.: US 6,602,785 B1
(45) Date of Patent: *Aug. 5, 2003

(54) METHOD OF FORMING A CONDUCTIVE CONTACT ON A SUBSTRATE AND METHOD OF PROCESSING A SEMICONDUCTOR SUBSTRATE USING AN OZONE TREATMENT

(75) Inventors: Sujit Sharan, Boise, ID (US); Gurtej S. Sandhu, Boise, ID (US); Terry Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

This patent is subject to a terminal disclaimer.

(21) Appl. No.: 09/614,361

(22) Filed: Jul. 12, 2000

Related U.S. Application Data

(63) Continuation of application No. 09/389,535, filed on Sep. 2, 1999, now Pat. No. 6,090,707.

(51) Int. Cl.$^7$ .................................................. H01L 21/44
(52) U.S. Cl. ........................ 438/682; 438/787; 438/664; 438/906
(58) Field of Search .................................. 438/664, 906, 438/618, 798, 680, 787, 768, 769, 770, 765, 756, 723, 677, 682

(56) References Cited

U.S. PATENT DOCUMENTS

| | | |
|---|---|---|
| 4,396,933 A | 8/1983 | Mago et al. |
| 4,589,928 A | 5/1986 | Dalton et al. |
| 4,761,384 A | 8/1988 | Nappi et al. |

(List continued on next page.)

FOREIGN PATENT DOCUMENTS

| | | |
|---|---|---|
| DE | 42 28 679 C2 | 8/1992 |
| DE | 198 40 236 A1 | 9/1998 |
| DE | 198 47 641 A1 | 10/1998 |
| EP | 0 715 343 A1 | 8/1994 |
| JP | 515224 | * 6/1993 |
| JP | 11-121397 | * 4/1999 |

OTHER PUBLICATIONS

S. Wolf et al. "Silicon Processing for the VLSI Era, vol. I" p. 669, Lattice Press (2000).*

Sumi et al., *New Silicidation Technology by SITOX (Silicidation Through Oxide) and Its Impaction Sub–half Micron MOS Devices*, IEEE, pp. 249–252 (1990).

*Primary Examiner*—Caridad Everhart
(74) *Attorney, Agent, or Firm*—Wells St. John P.S.

(57) ABSTRACT

The invention includes methods of forming a conductive silicide layers on silicon comprising substrates, and methods of forming conductive silicide contacts. In one implementation, a method of forming a conductive silicide layer on a silicon comprising substrate includes reacting oxygen with silicon of a silicon comprising substrate to form oxides of silicon from silicon of the substrate. The oxides of silicon include stoichiometric silicon dioxide and substoichiometric silicon dioxide. The stoichiometric silicon dioxide and substoichiometric silicon dioxide are exposed to ozone to transform at least some of the substoichiometric silicon dioxide to stoichiometric silicon dioxide. After the exposing, a conductive metal silicide is formed in electrical connection with silicon of the silicon comprising substrate. In one implementation, a method of forming a conductive silicide layer on a silicon comprising substrate includes reacting oxygen with silicon of a silicon comprising substrate to form oxides of silicon from silicon of the substrate. The oxides of silicon include stoichiometric silicon dioxide and substoichiometric silicon dioxide. The stoichiometric silicon dioxide and substoichiometric silicon dioxide are exposed to $O_2$ plasma to transform at least some of the substoichiometric silicon dioxide to stoichiometric silicon dioxide. After the exposing, a metal is reacted with silicon of the substrate to form a conductive metal silicide.

35 Claims, 5 Drawing Sheets

U.S. PATENT DOCUMENTS

| | | |
|---|---|---|
| 5,081,056 A | 1/1992 | Massali et al. |
| 5,111,270 A | 5/1992 | Tzeng |
| 5,334,908 A | 8/1994 | Zimmerman |
| 5,422,300 A | 6/1995 | Pfiester et al. |
| 5,474,949 A | 12/1995 | Hirao et al. ............. 437/60 |
| 5,527,745 A * | 6/1996 | Dixit et al. ............. 438/600 |
| 5,573,837 A | 11/1996 | Roberts et al. |
| 5,629,579 A | 5/1997 | Zimmerman |
| 5,660,681 A | 8/1997 | Fukuda et al. ............. 438/695 |
| 5,723,909 A * | 3/1998 | Yano et al. ............. 257/760 |
| 5,851,892 A | 12/1998 | Lojck et al. ............. 438/305 |
| 5,920,104 A | 7/1999 | Nayak et al. |
| 5,970,362 A | 10/1999 | Lyons et al. |
| 5,989,718 A | 11/1999 | Smith et al. |
| 6,020,254 A * | 2/2000 | Taguwa ............. 438/618 |
| 6,037,651 A | 3/2000 | Hasegawa |

* cited by examiner

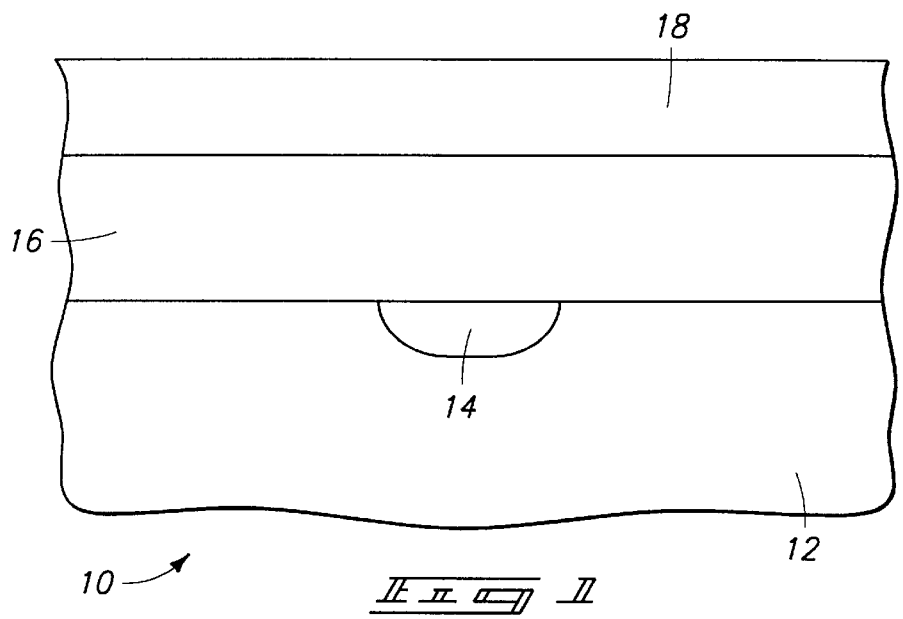
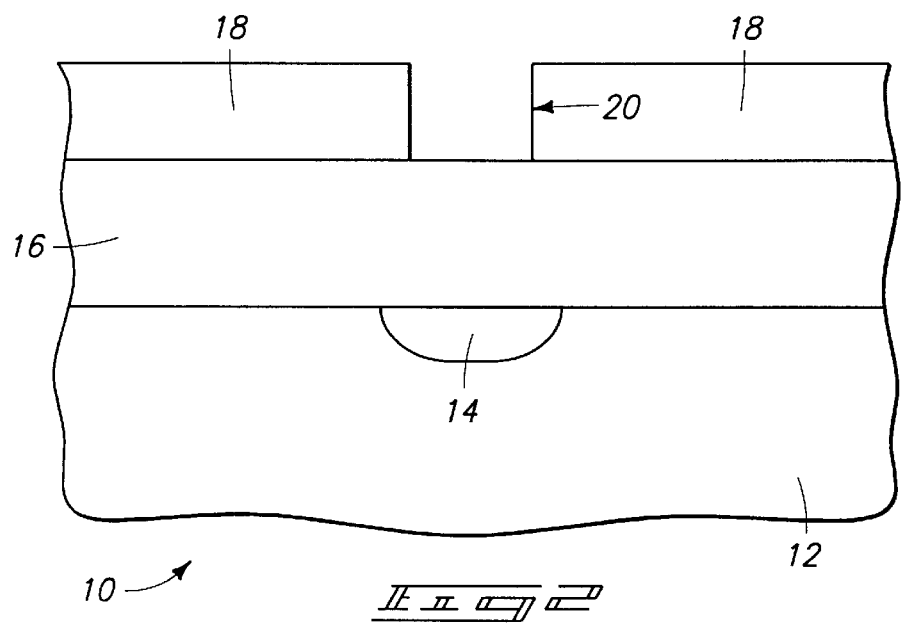

METHOD OF FORMING A CONDUCTIVE CONTACT ON A SUBSTRATE AND METHOD OF PROCESSING A SEMICONDUCTOR SUBSTRATE USING AN OZONE TREATMENT

RELATED PATENT DATA

This patent resulted from a continuation application of U.S. patent application Ser. No. 09/389,535, filed Sep. 2, 1999 now U.S. Pat. No. 6,090,707.

TECHNICAL FIELD

This invention relates to methods of forming a conductive silicide layer on a silicon comprising substrate and to methods of forming a conductive silicide contact.

BACKGROUND OF THE INVENTION

In the processing of integrated circuits, electrical contact is typically made to isolated active device regions formed within a wafer substrate typically comprising monocrystalline silicon. The active regions are typically connected by high electrically conductive paths or lines which are fabricated above an insulating material formed over the substrate surface. Further, electrical contact is also typically made to other conductive regions received outwardly of the bulk wafer, such as to conductive lines, contact plugs and other devices. To provide electrical connection between two conductive regions, an opening in an insulating layer is typically etched to the desired regions to enable subsequently formed conductive films to connect with such regions. Where the desired region comprises silicon, conductance can be greatly enhanced by forming a conductive metal silicide interface with the silicon region.

The drive for integrated circuits of greater complexity, performance and reduced size has driven designers to shrink the size of devices in the horizontal plane. Yet to avoid excessive current density, the horizontal scaling has not necessarily been accompanied by a reduction in the vertical dimension. This has resulted in an increase of the ratio of device height to device width, something generally referred to as aspect ratio, and particularly with respect to contact openings.

Increased aspect ratio can result in difficulties in the overall etching process typically used to etch openings through insulating materials for making an electrical contact. For example, one common insulating material within or through which electrical contact openings are etched is borophosphosilicate glass (BPSG). Photoresist is typically deposited and patterned over the BPSG to produce openings which will be transferred by subsequent etch to the BPSG. A typical process for etching a contact opening in BPSG includes dry anisotropic etching, with or without plasma. At the conclusion of the etch, the photoresist is stripped from the substrate. At the conclusion of the etch and during the strip, native silicon dioxide forms at the base of the contact opening on the silicon. The strip can have a tendency to transform this silicon dioxide into substoichiometric silicon dioxide. In the context of this document, "substoichiometric silicon dioxide" means $SiO_x$, where "x" is greater than 0 and less than 2.

Oxides of silicon remaining at the base of contact openings can preclude a conductive contact from being formed. Such are typically contended with in one of two ways. For example, it is known that deposition of titanium into the base of a contact opening over silicon dioxide can result in suitable conductive silicide contacts being formed through the oxide upon silicidation anneal if the oxide is suitably thin. Alternately, silicon dioxide can be stripped with a quick wet etch (i.e., using HF or tetramethylammonium hydroxide solutions) or dry etch immediately prior to metal deposition. Unfortunately, such methods do not etch away the substoichiometric silicon dioxide to the degree the stoichiometric silicon dioxide is etched away. Further, silicidation even where the metal is directly deposited onto the oxide is not uniform across the contact where stoichiometric and substoichiometric silicon dioxide are both present. This can lead to varying thickness silicide being formed at the base of the contact, or no silicide in some locations, resulting in increased contact resistance or leakage to the substrate.

While the invention was principally motivated and resulted from achieving solutions to the above-identified problems, the invention is not so limited, with the scope being defined by the accompanying claims as literally worded and interpreted in accordance with the Doctrine of Equivalents.

SUMMARY

The invention includes methods of forming a conductive silicide layers on silicon comprising substrates, and methods of forming conductive silicide contacts. In one implementation, a method of forming a conductive silicide layer on a silicon comprising substrate includes reacting oxygen with silicon of a silicon comprising substrate to form oxides of silicon from silicon of the substrate. The oxides of silicon include stoichiometric silicon dioxide and substoichiometric silicon dioxide. The stoichiometric silicon dioxide and substoichiometric silicon dioxide are exposed to ozone to transform at least some of the substoichiometric silicon dioxide to stoichiometric silicon dioxide. After the exposing, a conductive metal silicide is formed in electrical connection with silicon of the silicon comprising substrate.

In one implementation, a method of forming a conductive silicide layer on a silicon comprising substrate includes reacting oxygen with silicon of a silicon comprising substrate to form oxides of silicon from silicon of the substrate. The oxides of silicon include stoichiometric silicon dioxide and substoichiometric silicon dioxide. The stoichiometric silicon dioxide and substoichiometric silicon dioxide are exposed to $O_2$ plasma to transform at least some of the substoichiometric silicon dioxide to stoichiometric silicon dioxide. After the exposing, a metal is reacted with silicon of the substrate to form a conductive metal silicide.

BRIEF DESCRIPTION OF THE DRAWINGS

Preferred embodiments of the invention are described below with reference to the following accompanying drawings.

FIG. 1 is a diagrammatic fragmentary view of a semiconductor wafer fragment at one processing step in accordance with the invention.

FIG. 2 is a view of the FIG. 1 wafer at a processing step subsequent to that shown by FIG. 1.

DETAILED DESCRIPTION OF THE PREFERRED EMBODIMENTS

Figure 3:
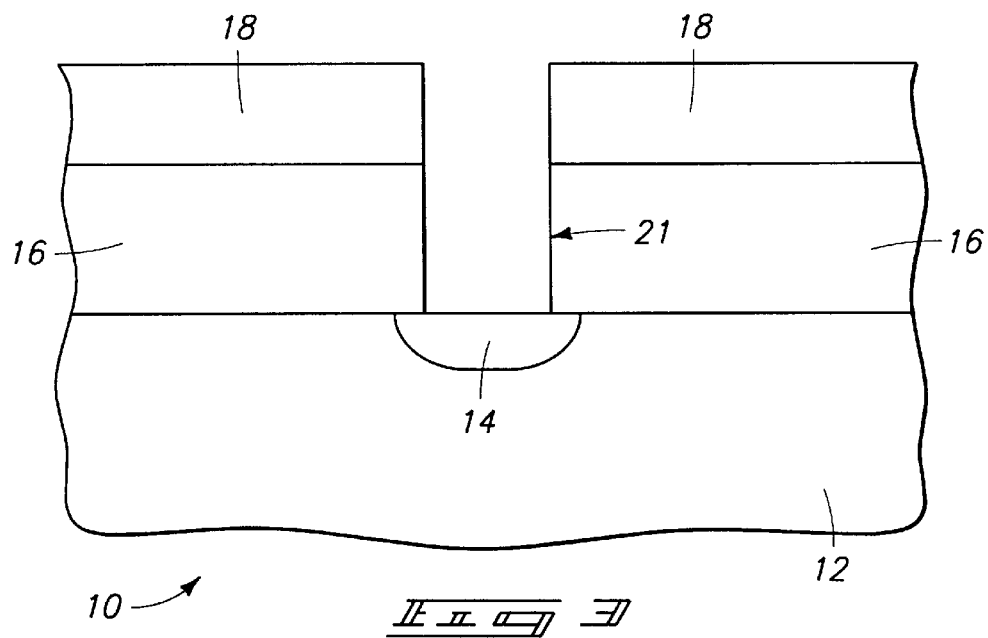
FIG. 3 is a view of the FIG. 1 wafer at a processing step subsequent to that shown by FIG. 2.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment is indicated generally with reference numeral 10. Such comprises a bulk monocrystalline silicon semiconductor substrate 12 having an exemplary conductive diffusion region 14 formed therein. In the context of this document, the term "semiconductor substrate" or "semiconductive substrate" is defined to mean any construction comprising semiconductive material, including, but not limited to, bulk semiconductive material such as a semiconductive wafer (either alone or in assemblies comprising other materials thereon), and semiconductor material layers (either alone or in assemblies comprising other materials). The term "substrate" refers to any supporting structure, including, but not limited to, the semiconductor substrate describes above. Further in the context of this document, "silicon comprising substrate" is intended to mean a substrate comprising monocrystalline silicon material, polycrystalline silicon material, and/or silicon compound materials. Diffusion region 14 constitutes but one example of a node location on a silicon comprising substrate to which electrical connection is desired.

An electrically insulating layer 16, such as BPSG, is formed over substrate 12. A masking layer 18 is formed thereover. An example and preferred material for layer 18 is photoresist, whereby photolithography will be utilized to pattern a contact opening to node location/diffusion region 14.

Referring to FIG. 2, masking layer 18 is patterned to form openings therein (preferably therethrough), such as illustrated opening 20 over diffusion region 14.

Referring to FIG. 3, an opening 21 is formed into insulating material 16 over node location 14 through photoresist opening 20, and preferably completely through insulating layer 16 as shown. Such etching preferably is a dry anisotropic etch, with or without plasma, and is conducted substantially selective relative to layer 16 and region 14. An example dry etching gas chemistry would include carbon and halogen components, with $CF_4$ being but one example. Wet or other etching could be conducted.

Figure 4:
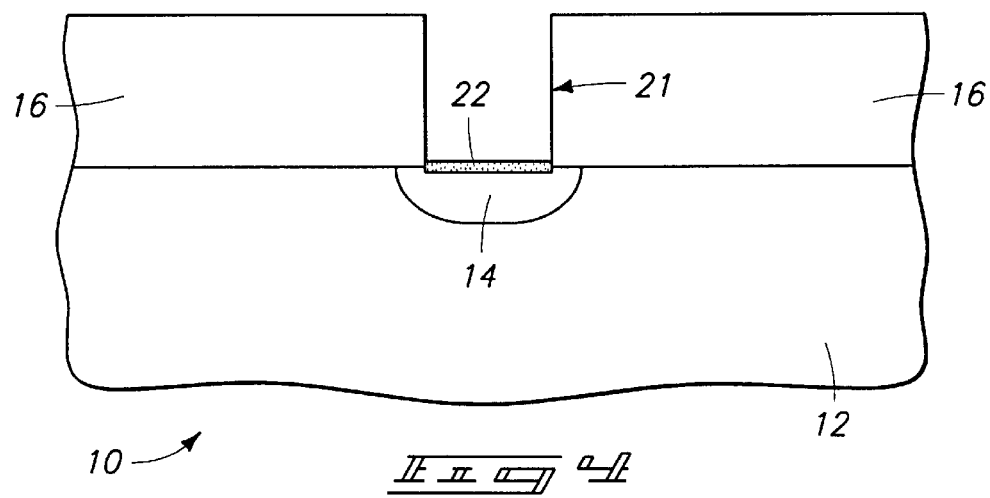
FIG. 4 is a view of the FIG. 1 wafer at a processing step subsequent to that shown by FIG. 3.

Referring to FIG. 4, and after forming opening 21 into insulating material 16, photoresist layer 18 is removed from the substrate. A typical process for removing such photoresist includes exposing the substrate to oxygen atoms, molecules and/or radicals at temperatures in the range of from 100° C. to 300° C. Such removing can form oxides of silicon from silicon of substrate 12 within insulating material opening 21, such as designated region 22. Such oxides of silicon comprise stoichiometric silicon dioxide and substoichiometric silicon dioxide. The stoichiometric and substoichiometric silicon dioxide might comprise a substantially homogenous mixture, or might be sporadically formed across the illustrated contact opening. Further, thickness might be substantially uniform or considerably varying across the contact opening. The above processing provides but one example of forming such oxides of silicon. Such oxides of silicon might be formed by other manners, whereby oxygen is reacted with silicon of a silicon comprising substrate. Further, a conductive silicide contact in accordance with the invention might be formed in the absence of a masking material layer. Further in accordance with an even broader considered aspect of the invention, the invention contemplates methods of forming a conductive silicide layer on a silicon comprising substrate regardless of contact formation through an insulating or other layer.

Figure 5:
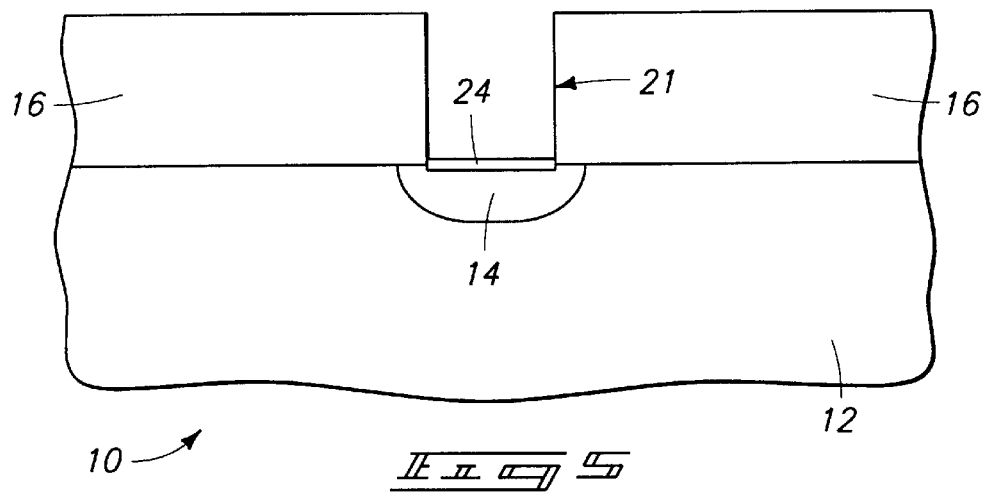
FIG. 5 is a view of the FIG. 1 wafer at a processing step subsequent to that shown by FIG. 4.

Referring to FIG. 5, the stoichiometric silicon dioxide and substoichiometric silicon dioxide 22 (FIG. 4) is exposed to ozone to transform at least some of the substoichiometric silicon dioxide to stoichiometric silicon dioxide. FIG. 5 illustrates substantially all of the substoichiometric oxide having been transformed to produce a stoichiometric silicon dioxide region 24. By way of preferred example only, the exposing could occur by feeding a combination of ozone gas and $O_2$ in combination to a reaction chamber within which wafer 10 is received. Alternately by way of preferred example only, ozone and $O_2$ might be fed separately to such a reaction chamber. Regardless, preferably ozone is fed to the reaction chamber at a volumetric flow rate from about 30% to about 50% of a combined flow rate of the ozone and $O_2$ to the chamber. The wafer is preferably maintained at a temperature of from about 300° C. to about 700° C., preferred reactor pressure being from about 2 Torr to about 20 torr, and processing preferably occurring for from about 10 to about 30 seconds. A more specific example would be at 400° C., 5 torr, and for 20 seconds. Further by way of example only, pure ozone might be fed to the wafer.

Figure 9:
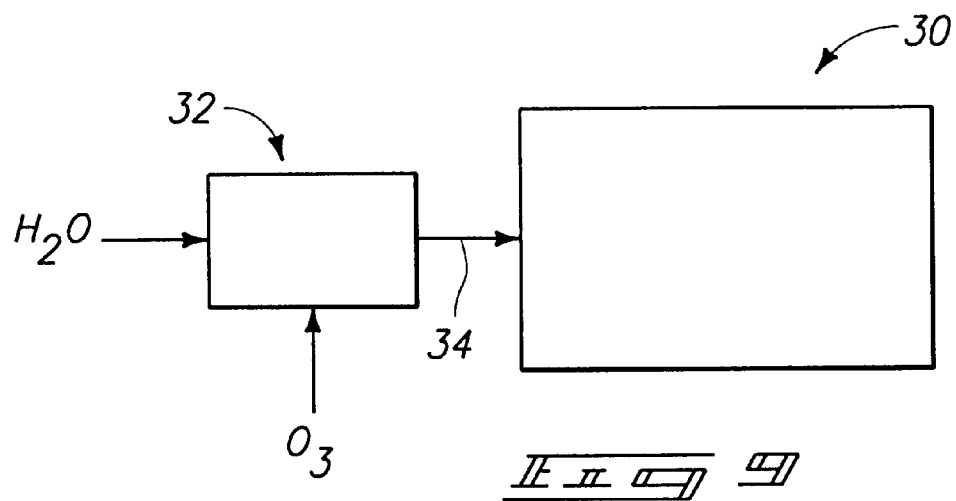
FIG. 9 is a diagrammatic representation of reactor feeds in a process in accordance with one aspect of the invention.
Figure 10:
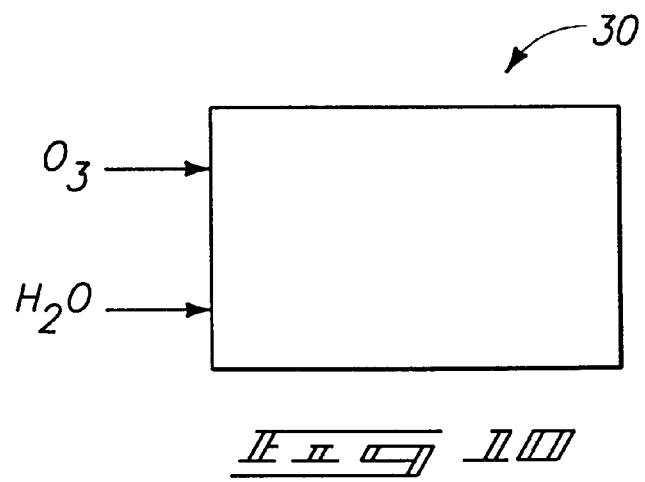
FIG. 10 is a diagrammatic representation of alternate reactor feeds in a process in accordance with one aspect of the invention.

Even further alternately by way of preferred example only, the exposing with ozone might also include exposing with $H_2O$, preferably with liquid $H_2O$. Regardless, the ozone and $H_2O$ might, for example, be combined externally of a reaction chamber with the combined ozone and $H_2O$ then fed to the reaction chamber. Such processing is diagrammatically depicted by way of example in FIG. 9. Wafer 10 would be received within a reaction chamber 30. A suitable bubbler device 32 is provided external of chamber 30 and includes a line 34 feeding therefrom to chamber 30. Liquid $H_2O$ would be fed to bubbler 32 as indicated, with a gaseous $O_3$ stream (preferably a combination of $O_2$ and $O_3$) bubbled therein also as shown. The combined liquid gas stream would be fed through line 34 to reaction chamber 30. Preferably, the ozone is present in line 34 at a concentration of from about 0.1 ppm to about 5.0 ppm as compared to the $H_2O$. An example preferred processing time range would be from 1 minute to 5 minutes; preferred pressure and temperature are room ambient. Such exemplary preferred processing will tend to produce a self limiting thickness growth or transformation of layer 22 to layer 24 of from 30 Angstroms to 40 Angstroms. FIG. 10 illustrates alternate exemplary processing in the chamber 30, whereby $H_2O$ and $O_3$ are separately fed to a reaction chamber 30.

Figure 6:
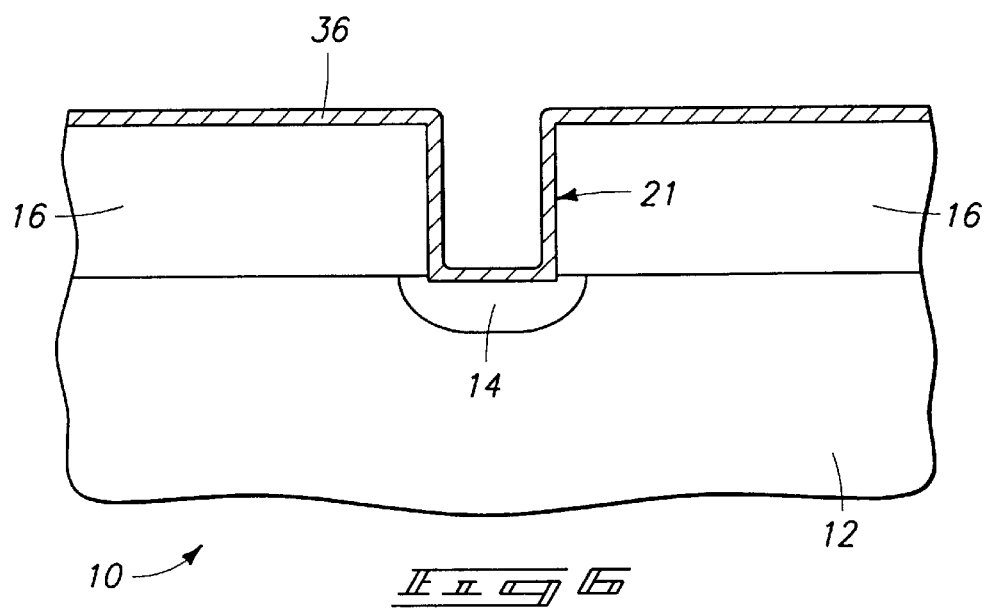
FIG. 6 is a view of the FIG. 1 wafer at a processing step subsequent to that shown by FIG. 5.
Figure 7:
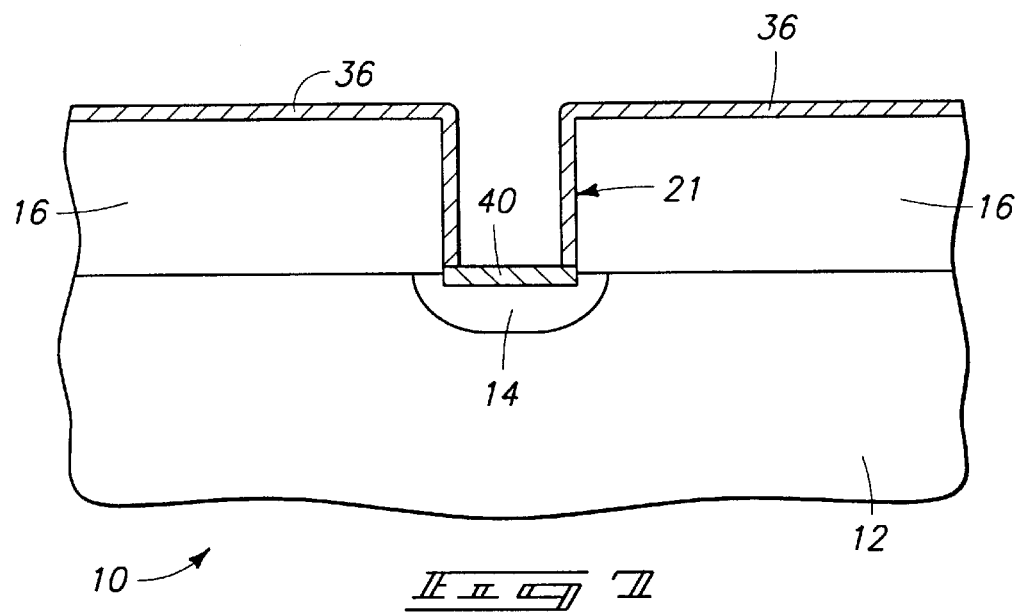
FIG. 7 is a view of the FIG. 1 wafer at a processing step subsequent to that shown by FIG. 6.

Referring to FIG. 6, preferably all of the substoichiometric silicon dioxide was transformed to stoichiometric silicon dioxide, and thereafter all of silicon dioxide layer 24 has been removed from opening 21. Removing of layer 24 might occur by wet, dry or other etching. A specific example wet etching would utilize 100 parts $H_2O$, 1 part HF, and 1 part TMAH by weight, with exposure for removal occurring at 27.6° C., ambient pressure, and for from about 1 to 2 minutes. An alternate example wet strip would utilize under the same conditions and time a solution comprising 33% ammonium fluoride, 3% $H_3PO_4$ and 64% $H_2O$, by weight. Further by way of example only, dry cleans would comprise plasma using chemistries such as $Ar/H_2$; $H_2/NF_3$; and $Ar/Cl_2$. Then, a metal layer 36 (i.e., one or more in elemental or alloy form) is preferably deposited, and thereby formed within insulating material opening 21. Alternately but less preferred, metal can be provided within insulating material opening 21 without removing region 24 from within opening 21. FIG. 7, shows metal 36 having been subjected to a conventional or to be developed salicidation process whereby metal reacts with silicon of the substrate to form a conductive metal silicide region 40. An example process would include RTP at from 700° C. to 800° C. for from 10 seconds to 30 seconds.

Example materials for layer 36 are refractory metals, such as titanium, cobalt or tungsten. Such might be deposited by chemical vapor deposition, physical vapor deposition, or other technique to deposit a metal everywhere as shown. Further and alternately by way of example only, the deposition might be as a silicide over the entirety of the wafer. Even further, and most preferably, the layer is deposited as a metal which reacts during deposition to form a silicide with silicon of the substrate with which the metal comes in contact. Where such deposits over silicon dioxide and or other non-silicon surfaces, metal is deposited. By way of example only, one specific chemical vapor deposition technique for achieving this more preferred method would be a gas flow to the reactor of 300 sccm of $TiCl_4$, 500 sccm of $H_2$, 5000 sccm per minute of argon, wafer/reactor temperature of 650° C., reactor pressure of 5 Torr, and RF power of 500 watts in a parallel plate capacitively coupled reactor for about 75 seconds.

Figure 8:
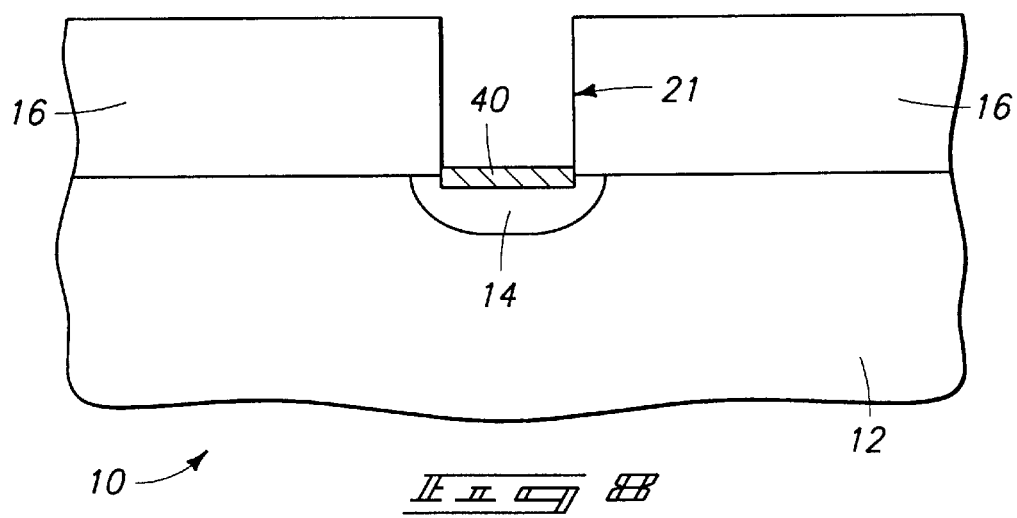
FIG. 8 is a view of the FIG. 1 wafer at a processing step subsequent to that shown by FIG. 7.

Referring to FIG. 8 and where a metal has been deposited, portions of layer 36 not directly exposed to silicon of substrate 12 do not significantly react to form suicide, and can be stripped by conventional or to be developed methods, leaving region 40 at the base of the contact opening. A stripping example includes submersion in a mixture of $NH_4OH/H_2O_2/H_2O$ (1:1:5, by volume) at 65° C. for 5 minutes. The remaining portion of opening 21 would ultimately be filled with a conductive material for forming a conductive plug contact to diffusion region 14.

An alternate process of transforming at least some of the substoichiometric silicon dioxide to stoichiometric silicon dioxide comprises exposure to $O_2$ plasma in a plasma reactor. Specific preferred processing for a parallel plate capacitively coupled reactor includes pressure from about 2 to 10 torr, susceptor temperature from about 400° C. to about 500° C., power from about 300 watts to 700 watts, example gas flows from about 100 to 500 sccm of $O_2$, and from about 1000 sccm to 2000 sccm of Ar for from about 10 to 60 seconds. A preferred specific example would be at 5 torr, 450° C., 300 sccm of $O_2$, 1500 sccm of Ar, 500 watts of power for 45 seconds.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact on a substrate, comprising:

reacting oxygen with silicon to form oxides of silicon over a contact node location on a substrate, the oxides of silicon comprising stoichiometric silicon dioxide and substoichiometric silicon dioxide;

exposing the stoichiometric silicon dioxide and substoichiometric silicon dioxide to ozone and $H_2O$ to transform at least some of the substoichiometric silicon dioxide proximate the contact node location to stoichiometric silicon dioxide;

after the exposing, removing the oxides of silicon from over the node location; and forming a conductive material in electrical connection with the contact node location.

2. The method of claim 1 wherein the exposing occurs in a reaction chamber, and wherein the ozone is fed to the reaction chamber as a gas in combination with $O_2$.

3. The method of claim 1 wherein the conductive material comprises a metal silicide.

4. The method of claim 1 wherein the conductive material comprises a conductive compound.

5. The method of claim 1 wherein the conductive material comprises an elemental metal.

6. The method of claim 1 wherein the conductive material comprises a refractory metal.

7. The method of claim 1, comprising prior to the exposing to ozone, bubbling an ozone-comprising gas through liquid water, the bubbling providing water to the ozone-comprising gas.

8. A method of forming a conductive contact on a substrate, comprising:

reacting oxygen with silicon to form oxides of silicon over a contact node location on a substrate, the oxides of silicon comprising stoichiometric silicon dioxide and substoichiometric silicon dioxide;

exposing the stoichiometric silicon dioxide and substoichiometric silicon dioxide to ozone and $H_2O$ to transform at least some of the substoichiometric silicon dioxide proximate the contact node location to stoichiometric silicon dioxide; and after the exposing, forming a conductive material on the oxides of silicon over the contact node location.

9. The method of claim 8 wherein the exposing occurs in a reaction chamber, and wherein the ozone is fed to the reaction chamber as a gas in combination with $O_2$.

10. A method of forming a conductive contact on a substrate, comprising:

forming an insulating material over a substrate;

forming an opening into the insulating material over a node location on the substrate to which electrical connection is desired;

forming oxides of silicon within the opening over the node location, the oxides of silicon comprising stoichiometric silicon dioxide and substoichiometric silicon dioxide;

exposing the stoichiometric silicon dioxide and the substoichiometric silicon dioxide to ozone and $H_2O$ to transform at least some of the substoichiometric silicon dioxide to stoichiometric silicon dioxide; and after the exposing, forming a conductive material in electrical connection with the contact node location within the opening.

11. The method of claim 10 comprising after the exposing, removing transformed stoichiometric silicon dioxide from the opening prior to forming the conductive material within the opening.

12. The method of claim 11 wherein the removing comprises a wet etch.

13. The method of claim 11 wherein the removing comprises a dry etch.

14. The method of claim 10 wherein the exposing transforms substantially all of the substoichiometric silicon dioxide to stoichiometric silicon dioxide; and further comprising after the exposing, removing substantially all stoichiometric silicon dioxide from the opening prior to forming the conductive material within the opening.

15. The method of claim 10 comprising forming a masking layer over the insulating material and forming an opening through the masking layer over the node location;

the opening into the insulating material layer being formed through the opening in the masking layer;

after forming the opening into the insulating material layer, removing the masking layer from the substrate; and the substoichiometric silicon dioxide being formed during the removing.

16. The method of claim 10 wherein the exposing occurs in a reaction chamber, and wherein the ozone is fed to the reaction chamber as a gas in combination with $O_2$.

17. A method of processing a semiconductor substrate, comprising:

reacting oxygen with silicon to form a layer of oxides of silicon over a semiconductor a substrate, the oxides of silicon comprising stoichiometric silicon dioxide and substoichiometric silicon dioxide;

exposing the stoichiometric silicon dioxide and substoichiometric silicon dioxide of the layer to ozone and $H_2O$ to transform at least some of the substoichiometric silicon dioxide proximate the contact node location to stoichiometric silicon dioxide; and after the exposing, removing all of layer of the oxides of silicon from the semiconductor substrate.

18. The method of claim 17 wherein the exposing transforms substantially all of the substoichiometric silicon dioxide to stoichiometric silicon dioxide.

19. The method of claim 17 wherein the exposing occurs in a reaction chamber, and wherein the ozone is fed to the reaction chamber as a gas in combination with $O_2$.

20. The method of claim 17, comprising prior to the exposing to ozone, bubbling an ozone-comprising gas through liquid water, the bubbling providing water to the ozone-comprising gas.

21. A method of forming a conductive contact on a substrate, comprising:

reacting oxygen with silicon to form oxides of silicon over a contact node location on a substrate, the oxides of silicon comprising stoichiometric silicon dioxide and substoichiometric silicon dioxide;

exposing the stoichiometric silicon dioxide and substoichiometric silicon dioxide to ozone in a non-plasma environment within a reaction chamber to transform at least some of the substoichiometric silicon dioxide proximate the contact node location to stoichiometric silicon dioxide, the exposing to ozone comprising feeding pure ozone into the reaction chamber;

after the exposing, removing the oxides of silicon from over the node location; and after the exposing, forming a conductive material in electrical connection with the contact node location.

22. A method of forming a conductive contact on a substrate, comprising:

forming an insulating material over a substrate;

forming an opening into the insulating material over a node location on the substrate to which electrical connection is desired;

forming oxides of silicon within the opening over the node location, the oxides of silicon comprising stoichiometric silicon dioxide and substoichiometric silicon dioxide;

exposing the stoichiometric silicon dioxide and the substoichiometric silicon dioxide to ozone in a non-plasma environment to transform at least some of the substoichiometric silicon dioxide to stoichiometric silicon dioxide, the exposing to ozone comprising exposing to ozone and oxygen where the volumetric flow rate of ozone is from about 30% to about 50% of the combined volumetric flow rate of ozone and oxygen; and after the exposing, forming a conductive material in electrical connection with the contact node location within the opening.

23. The method of claim 22 comprising after the exposing, removing transformed stoichiometric silicon dioxide from the opening prior to forming the conductive material within the opening.

24. The method of claim 23 wherein the removing comprises a wet etch.

25. The method of claim 23 wherein the removing comprises a dry etch.

26. The method of claim 22 wherein the exposing transforms substantially all of the substoichiometric silicon dioxide to stoichiometric silicon dioxide; and further comprising after the exposing, removing substantially all stoichiometric silicon dioxide from the opening prior to forming the conductive material within the opening.

27. The method of claim 22 comprising forming a masking layer over the insulating material and forming an opening through the masking layer over the node location;

the opening into the insulating material layer being formed through the opening in the masking layer;

after forming the opening into the insulating material layer, removing the masking layer from the substrate; and the substoichiometric silicon dioxide being formed during the removing.

28. A method of forming a conductive contact on a substrate, comprising:

reacting oxygen with silicon to form oxides of silicon over a contact node location on a substrate, the oxides of silicon comprising stoichiometric silicon dioxide and substoichiometric silicon dioxide;

exposing the stoichiometric silicon dioxide and substoichiometric silicon dioxide to ozone to transform at least some of the substoichiometric silicon dioxide proximate the contact node location to stoichiometric silicon dioxide, the exposing to ozone comprising exposing to ozone and oxygen where the volumetric flow rate of ozone is from about 30% to about 50% of the combined volumetric flow rate of ozone and oxygen;

after the exposing, removing the oxides of silicon from over the node location; and forming a conductive material in electrical connection with the contact node location.

29. The method of claim 28, where the substrate is maintained at a temperature from about 300° C. to about 700° C.

30. A method of processing a semiconductor substrate, comprising:

reacting oxygen with silicon to form a layer of oxides of silicon over a semiconductor a substrate, the oxides of silicon comprising stoichiometric silicon dioxide and substoichiometric silicon dioxide;

exposing the stoichiometric silicon dioxide and substoichiometric silicon dioxide of the layer to ozone to transform at least some of the substoichiometric silicon dioxide proximate the contact node location to stoichiometric silicon dioxide, the exposing to ozone comprising exposing to ozone and oxygen where the volumetric flow rate of ozone is from about 30% to about 50% of the combined volumetric flow rate of ozone and oxygen; and after the exposing, removing all of layer of the oxides of silicon from the semiconductor substrate.

31. The method of claim 30, where the substrate is maintained at a temperature from about 300° C. to about 700° C.

32. A method of forming a conductive contact on a substrate, comprising:

forming a layer of insulating material over a silicon comprising substrate;

forming an opening through the insulating material over a node location of the silicon comprising substrate;

forming an oxide material within the opening, the oxide material comprising $SiO_x$ where x is greater than 0 and less than 2;

after forming the oxide material, converting at least some of the $SiO_x$ to $SiO_2$, the converting comprising exposing the oxide material to ozone;

after the converting, removing the oxide material within the opening;

depositing a metal within the opening, a first portion of the metal reacting with silicon of the substrate to form a silicide and a second portion of the metal remaining non-silicide; and removing the second portion of metal from within the opening.

33. The method of claim 32 wherein the forming the opening comprises forming a patterned masking layer over the insulating material, transferring the pattern to the insulating material to form the opening and subsequent removal of the masking layer, and wherein the oxide material is formed during the removing of the masking layer.

34. The method of claim 32 wherein the exposing to ozone occurs in a reaction chamber and comprises flowing ozone and $O_2$ into the reaction chamber.

35. The method of claim 32 wherein the converting comprises exposing the oxide material to ozone and water.

* * * * *

UNITED STATES PATENT AND TRADEMARK OFFICE
CERTIFICATE OF CORRECTION

PATENT NO. : 6,602,785 B1
DATED : August 5, 2003
INVENTOR(S) : Sharan et al.

It is certified that error appears in the above-identified patent and that said Letters Patent is hereby corrected as shown below:

Column 3,
Line 31, replace "describes" with -- described --.

Column 4,
Line 32, replace "torr" with -- Torr --.

Column 5,
Line 12, replace "salicidation" with -- silicidation --.
Line 37, replace "suicide" with -- silicide --.

Column 7,
Line 27, delete "a" after "semiconductor".

Column 9,
Line 4, delete "a" after "semiconductor".

Signed and Sealed this

Third Day of February, 2004

JON W. DUDAS
*Acting Director of the United States Patent and Trademark Office*